(12) United States Patent
Ohmi

(10) Patent No.: US 8,941,091 B2
(45) Date of Patent: Jan. 27, 2015

(54) GATE ELECTRODE COMPRISING ALUMINUM AND ZIRCONIUM

(71) Applicant: Tadahiro Ohmi, Sendai (JP)

(72) Inventor: Tadahiro Ohmi, Sendai (JP)

(73) Assignee: National University Corporation Tohoku University, Miyagi (JP)

( * ) Notice: Subject to any disclaimer, the term of this patent is extended or adjusted under 35 U.S.C. 154(b) by 0 days.

(21) Appl. No.: 13/949,284

(22) Filed: Jul. 24, 2013

(65) Prior Publication Data

US 2013/0307092 A1  Nov. 21, 2013

Related U.S. Application Data

(63) Continuation of application No. PCT/JP2011/000530, filed on Jan. 31, 2011.

(51) Int. Cl.
| | | |
|---|---|---|
| *H01L 47/00* | (2006.01) | |
| *H01L 21/44* | (2006.01) | |
| *H01L 29/423* | (2006.01) | |
| *H01L 29/49* | (2006.01) | |
| *H01L 29/40* | (2006.01) | |
| *H01L 29/66* | (2006.01) | |

(52) U.S. Cl.
CPC .......... *H01L 29/42364* (2013.01); *H01L 21/44* (2013.01); *H01L 29/42316* (2013.01); *H01L 29/4908* (2013.01); *H01L 29/401* (2013.01); *H01L 29/42384* (2013.01); *H01L 29/66765* (2013.01)
USPC ............................................. 257/4; 438/656

(58) Field of Classification Search
CPC ... H01L 29/517; H01L 29/408; H01L 29/792; H01L 21/31641; H01L 21/44; H01L 29/42316; H01L 28/60
USPC ............................... 257/412, 4; 438/403, 416
See application file for complete search history.

(56) References Cited

U.S. PATENT DOCUMENTS

| | | | | |
|---|---|---|---|---|
| 3,599,053 | A * | 8/1971 | Iida et al. ..................... | 361/508 |
| 2001/0001482 | A1 | 5/2001 | Ishida et al. | |
| 2003/0080436 | A1 | 5/2003 | Ishikawa | |
| 2008/0207077 | A1* | 8/2008 | Haase ............................ | 445/22 |
| 2008/0217617 | A1 | 9/2008 | Sugawa et al. | |
| 2012/0119216 | A1 | 5/2012 | Ohmi | |

FOREIGN PATENT DOCUMENTS

| | | |
|---|---|---|
| JP | 02-85826 | 3/1990 |
| JP | 06-326130 | 11/1994 |
| JP | 07-245434 | 9/1995 |
| JP | 10-319441 | 12/1998 |
| JP | 11-52415 | 2/1999 |
| JP | 2006-210477 | 8/2006 |
| JP | 2007-043131 | 2/2007 |
| JP | 2009-021621 | 1/2009 |
| WO | 2011/013600 | 2/2011 |

* cited by examiner

*Primary Examiner* — William D Coleman
(74) *Attorney, Agent, or Firm* — Fitzpatrick, Cella, Harper & Scinto

(57) ABSTRACT

A semiconductor device includes a gate electrode which is formed on a substrate, and contains Al and Zr, a gate insulating film which is formed to cover at least the upper surface of the gate electrode, and contains Al and Zr, and an insulator layer formed on the substrate to surround the gate electrode.

18 Claims, 7 Drawing Sheets

GATE ELECTRODE COMPRISING ALUMINUM AND ZIRCONIUM

This application is a continuation of International Application No. PCT/JP2011/000530 filed on Jan. 31, 2011, the entire content of which is incorporated herein by reference.

BACKGROUND OF THE INVENTION

1. Field of the Invention

The present invention relates to a semiconductor device and a method of manufacturing the same.

2. Description of the Related Art

In general, a display device such as a liquid crystal display device, an organic EL device, or an inorganic EL device is formed by sequentially depositing films of conductive patterns including wiring patterns and electrode patterns on a substrate having a flat principal surface, and patterning these films. An electrode film, and various types of films required for elements which constitute a display device, for example, are sequentially deposited and patterned to manufacture the display device.

CITATION LIST

Patent Literature

PTL1: Japanese Patent Laid-Open No. 2007-43131

SUMMARY OF THE INVENTION

PTL1 discloses a manufacturing method including the step of forming a resin film on an insulating substrate, the step of patterning the resin film to form a recessed portion which receives an electrode or a wiring line, the step of supplying a catalyst to the recessed portion, the step of curing the resin film by heat, and the step of forming a conductive material in the recessed portion using the plating method. A gate electrode is formed by, for example, forming a Cu layer using the electroless plating method, and forming a W layer on the Cu layer as a Cu diffusion inhibition layer using the selective CVD method, or forming an Ni layer using the electroless plating method.

Unfortunately, in this method, the surface of the gate electrode is so rough that a gate insulating layer formed on the gate electrode has poor flatness. In either case, it is difficult to form a very thin gate insulating layer, leading to degradation in current driving capacity of a TFT.

The present invention provides a semiconductor device having a thin gate insulating layer with good electrical characteristics, and a method of manufacturing the same.

According to the first aspect of the present invention, there is provided a semiconductor device comprising a gate electrode which is formed on a substrate, and contains Al and Zr, a gate insulating film which is formed to cover at least an upper surface of the gate electrode, and contains Al and Zr, and an insulator layer formed on the substrate to surround the gate electrode.

The thickness of the gate insulating film is preferably 20 nm (inclusive) to 80 nm (inclusive). Note that because the current driving capacity of the semiconductor device or transistor is proportional to the reciprocal of the thickness of the gate insulating film, the thickness of the gate insulating film is as small as possible to improve the current driving capacity, and is preferably 80 nm or less. On the other hand, the withstand voltage of the gate insulating film depends on the thickness of the gate insulating film, and the thickness of the gate insulating film is preferably 20 nm or more in this respect. Note that a gate insulating film containing Al and Zr is not known.

In the gate electrode, the concentration of Mg is preferably 1 mass % or less, more preferably 0.1 mass % or less, still more preferably 0.01 mass % or less, and still more preferably a detection limit or less (for example, 0.01 mass % or less, depending on the detection method) or zero concentration. This is advantageous in terms of reducing the wiring resistance of the gate electrode to shorten the wiring delay. Also, a gate insulating film can be formed by anodizing the gate electrode using, for example, a non-aqueous solution, and the concentration of Mg is preferably 0.01 mass % or less to form a high-quality gate insulating film in this anodization. The anodization is performed in the pH range of, for example, 6 to 9 in which Mg dissolves in the non-aqueous solution (Mg dissolves in the non-aqueous solution at pH=11.5 or less). When Mg dissolves in the non-aqueous solution, the quality (for example, the insulation properties and surface flatness) of the gate insulating film formed by anodization may degrade.

In another aspect, the gate electrode preferably contains Mg with a concentration of 1 mass % or less, and Zr with a concentration of 0.01 mass % (exclusive) to 0.15 mass % (inclusive) (the concentration of Mg is more preferably 0.1 mass % or less, and still more preferably 0.01 mass % or less). Note that the concentration of Zr is preferably 0.05 mass % (exclusive) to 0.15 mass % (inclusive), and most preferably 0.1 mass % (exclusive) to 0.15 mass % (inclusive). The reason why the concentration of Mg is preferably 0.01 mass % or less is as explained earlier. The upper limit (0.15 mass %) of the concentration of Zr is determined by the maximum amount of solid dissolution in Al. Doping Zr in Al is effective in suppressing an increase in size of crystal grains of Al to suppress generation of stress due to the heat history in the manufacturing process.

The gate electrode may further contain Ce. In addition, the gate electrode can contain unavoidable impurities, and their elements can have concentrations of 0.01 mass % or less. The elements of the unavoidable impurities mainly include Si, Fe, and Cu, but Mn, Cr, and Zn, for example, unavoidably mix from, for example, a base metal material, a scrap, or a tool used in smelting an alloy. When the concentration of Mg is to be minimized without intentionally doping Mg, Mg can also be construed as an unavoidable impurity. To obtain an alloy containing unavoidable impurities with concentrations of 0.01 mass % or less, it is preferable to use a material smelted using a base metal containing highly pure Al with a concentration of 99.98 mass % or more, which is obtained by, for example, the segregation method or the trinal electrolytic method.

Unavoidable impurities normally mix in a general-purpose Al alloy by about several parts per thousand, but are preferably kept in an amount of 0.01 mass % or less to avoid adverse effects such as degradation in uniformity of a film generated by an anodization. Since an anodic oxide film of an aluminum alloy and, especially, an aluminum oxide film formed by anodization using a non-aqueous solution (to be described later) has a heat stability and density high enough not to form, for example, a void or a gas cavity, it is very excellent in corrosion resistance against chemical agents and halogen gas, especially chlorine gas, and is, in turn, excellent in electrical characteristics as, for example, the insulation strength is high, and the leakage current is low. Also, since a film as very thin as about 0.1 μm can be formed, the current driving capacity of a transistor significantly improves.

A gate insulating film can be formed by anodization using a non-aqueous solution, as described earlier. The gate insulating film formed by such anodization can be a nonporous anodic oxide film.

The substrate can be a substantially transparent insulator substrate, and the insulator layer can be a substantially transparent resin layer.

The resin layer can be one or more types of resins selected from the group consisting essentially of acrylic resin, silicone resin, fluorine resin, polyimide resin, polyolefin resin, alicyclic olefin resin, and epoxy resin.

The resin layer can be formed by an alkali-soluble alicyclic olefin resin composition.

The substrate can include alkali glass, and an alkali diffusion preventive film formed on the alkali glass. The alkali diffusion preventive film can be a substantially transparent insulator coating film. The insulator coating film can be a film obtained by drying and calcining a liquid coating film containing at least one of a metal organic compound and a metal inorganic compound, and a solvent.

According to the second aspect of the present invention, there is provided a method of manufacturing a semiconductor device, comprising the steps of forming a gate electrode containing Al and Zr on a substrate, forming a gate insulating film by anodizing a surface of the gate electrode by an anodizing method which uses a non-aqueous solution, and forming an insulator layer on the substrate to surround the gate electrode.

In the step of forming the gate insulating film, a gate insulating film is preferably formed to have a thickness of 20 nm (inclusive) to 80 nm (inclusive). In the step of forming the gate electrode, a gate electrode containing Mg with a concentration of 0.01 mass % or less, Al, and Zr is preferably formed. In the step of forming the gate electrode, a gate electrode containing Mg with a concentration of 0.01 mass % or less, Zr with a concentration of 0.01 mass % (exclusive) to 0.15 mass % (inclusive), Al, and Zr is preferably formed. In the step of anodization by an anodizing method which uses a non-aqueous solution as a chemical conversion solution preferably includes the step of forming a nonporous amorphous aluminum oxide passivation film by anodization in a chemical conversion solution containing an organic solvent which has a dielectric constant lower than that of water and dissolves water. While the dielectric constant of water is about 80, the binding energy of substances is inversely proportional to the square of the dielectric constant, so water dissociates in, for example, an HF solution with a dielectric constant of 83 higher than that of water even at 0° C.

Accordingly, to prevent water from dissociating and a grown aluminum oxide film from being etched, the surface of the gate electrode need only be anodized in a chemical conversion solution containing an organic solvent which has a dielectric constant lower than that of water, dissolves water, and has a low vapor pressure. This makes it possible to form a nonporous amorphous aluminum oxide passivation film.

Examples of such an organic solvent include ethylene glycol with a dielectric constant of 39, diethylene glycol with a dielectric constant of 33, triethylene glycol with a dielectric constant of 24, and tetraethylene glycol with a dielectric constant of 20. Hence, the use of these organic solvents allows an effective decrease in dielectric constant to apply a high voltage without the occurrence of water electrolysis. The use of, for example, ethylene glycol makes it possible to apply a maximum anodization voltage of 200 V without the occurrence of water electrolysis to form a nonporous amorphous aluminum oxide passivation film with a thickness of 0.3 μm. The use of diethylene glycol makes it possible to apply a maximum anodization voltage of 200 V without the occurrence of water electrolysis to form a nonporous amorphous aluminum oxide passivation film with a thickness of 0.4 μm.

An electrolyte which imparts electroconductivity to a non-aqueous solution serving as a chemical conversion solution is added to the non-aqueous solution, but the chemical conversion solution corrodes an aluminum member if the solution becomes acidic upon the addition. Accordingly, an electrolyte capable of preventing corrosion of aluminum by setting the pH to 6 to 9, preferably 5.5 to 8.5, and more preferably 6 to 8 while increasing the electroconductivity of the chemical conversion solution, such as an adipate, is used. As a typical example, a chemical conversion solution containing 79% of an organic solution, 20% of water, and 1% of an electrolyte is used.

Note that the pH of the chemical conversion solution is preferably 4 or more, more preferably 5 or more, and still more preferably 6 or more. Also, the pH of the chemical conversion solution is normally 10 or less, more preferably 9 or less, and still more preferably 8 or less. It is desired to set the pH close to neutrality to make it hard for a metal oxide film generated by anodization to dissolve in the chemical conversion solution.

The chemical conversion solution preferably shows a buffer action when the pH falls within the range of 6 to 9 to buffer fluctuations in concentration of various substances during chemical conversion so as to maintain the pH within a predetermined range. Therefore, the chemical conversion solution desirably contains a compound such as an acid or a base that shows a buffer action. Although the type of such compound is not particularly limited, the compound used is preferably at least one type of compound selected from the group consisting essentially of boric acid, phosphoric acid, carboxylic acid, and their salts in terms of high solubility in the chemical conversion solution, and high dissolution stability. The compound used is more preferably an organic carboxylic acid or its salt that does not allow boron and phosphorus to remain in the anodic oxide film.

Solute components mix in an oxide film generated by an anodizing process albeit in a very small amount, but the possibility that boron and phosphorus will elute from the oxide film becomes totally zero when an organic carboxylic acid or its salt is used as a solute, so the quality of the formed thin film, and the performance of, for example, a device using this film are expected to stabilize and improve. To achieve, for example, a given solution stability, a given safety, and a good buffer action, tartaric acid, citric acid, or adipic acid is especially preferable. Of these acids, one type of acid may be used or two or more types of acids may be used in combination.

The concentration of these compounds is normally 0.01 mass % or more, preferably 0.1 mass % or more, and more preferably 1 mass % or more to the overall mass % of the chemical conversion solution. To increase the electroconductivity so as to satisfactorily form an oxide film, the concentration of those compounds is desirably set high. However, the concentration of those compounds is normally set to be 30 mass % or less, preferably 15 mass % or less, and more preferably 10 mass % or less. To keep the performance of the oxide film high and the cost low, it is desired to set the concentration of those compounds equal to or lower than the above values.

As described above, ethylene glycol, propylene glycol, or diethylene glycol is especially preferably used as a non-aqueous solvent for a chemical conversion solution used to form an anodic oxide film, and they may be used solely or in combination. However, the chemical conversion solution may contain water as long as it contains a non-aqueous solvent.

The concentration of the non-aqueous solvent is normally 10 mass % or more, preferably 30 mass % or more, more preferably 50 mass % or more, and especially preferably 55 mass % or more to the overall mass % of the chemical conversion solution. Note that the concentration of the non-aqueous solvent is normally 95 mass % or less, preferably 90 mass % or less, and especially preferably 85 mass % or less.

If the chemical conversion solution contains not only a non-aqueous solvent but also water, the water content is normally 1 mass % or more, preferably 5 mass % or more, more preferably 10 mass % or more, and especially preferably 15 mass % or more, and is also normally 85 mass % or less, preferably 50 mass % or less, and especially preferably 40 mass % or less.

The ratio of water to a non-aqueous solvent is preferably 1 mass % or more, preferably 5 mass % or more, more preferably 7 mass % or more, and especially preferably 10 mass % or more, and is also normally 90 mass % or less, preferably 60 mass % or less, more preferably 50 mass % or less, and especially preferably 40 mass % or less.

The step of anodization by an anodizing method which uses a non-aqueous solution preferably includes the step of performing chemical conversion using a constant current up to a chemical conversion voltage Vf determined in advance, and performing anodization by maintaining the chemical conversion voltage Vf for a predetermined time after it is reached.

At this time, to efficiently form an oxide film, the current density is normally 0.001 mA/cm$^2$ or more, and preferably 0.01 mA/cm$^2$ or more. However, to obtain an oxide film with good surface flatness, the current density is normally 100 mA/cm$^2$ or less, and preferably 10 mA/cm$^2$ or less.

Also, the chemical conversion voltage Vf is normally 3 V or more, preferably 10 V or more, and more preferably 20 V or more. The thickness of the obtained oxide film is associated with the chemical conversion voltage Vf, so the above-mentioned voltage or more is preferably applied to make the oxide film have a predetermined thickness. Note that the chemical conversion voltage Vf is normally 1,000 V or less, preferably 700 V or less, and more preferably 500 V or less. Because the obtained oxide film has high insulation properties, chemical conversion is preferably done at the above-mentioned voltage or less to form an oxide film with good quality without the occurrence of dielectric breakdown.

The step of forming the insulator layer on the substrate can include the steps of forming a material which forms the insulator layer to extend from a position on the substrate to a position on the gate electrode, and removing the surface of the material, which forms the insulator layer, using a plasma containing oxygen.

The step of removing the gate insulating film using the plasma can include the steps of exposing the gate insulating film, and modifying the exposed gate insulating film using the plasma.

According to the present invention, it is possible to provide a semiconductor device having a thin gate insulating layer with good electrical characteristics, and a method of manufacturing the same.

DESCRIPTION OF THE EMBODIMENTS

The first embodiment of the present invention will be described with reference to the accompanying drawings.

Figure 1:
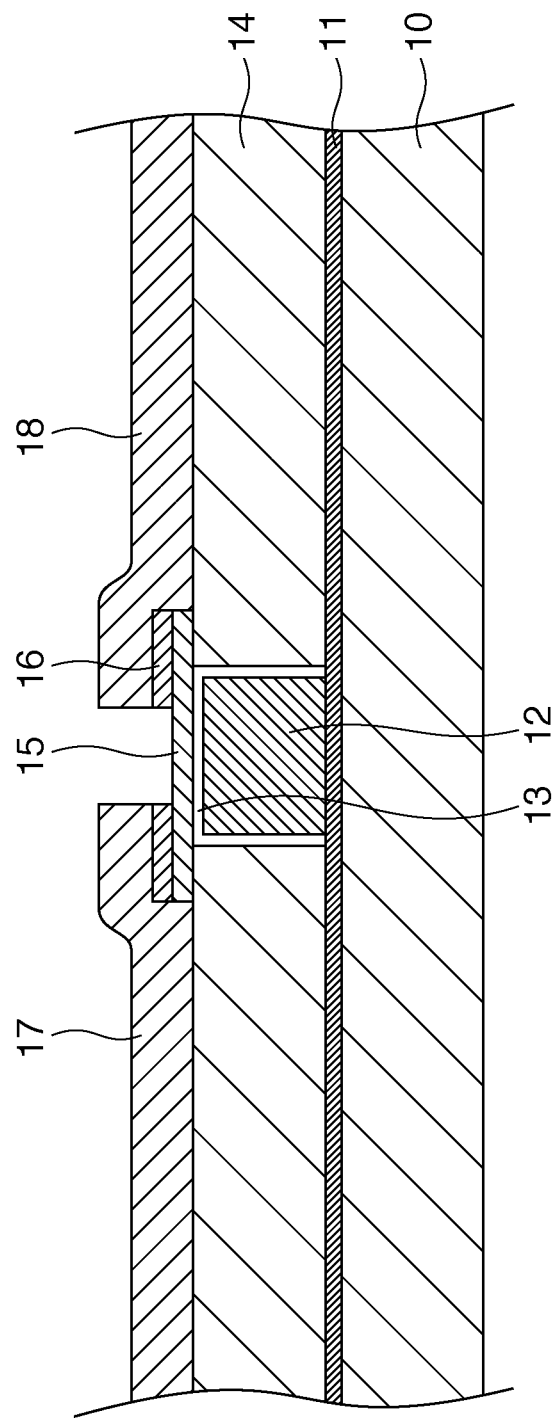
FIG. 1 is a sectional view showing the structure of a thin film transistor according to the first embodiment of the present invention.

FIG. 1 is a sectional view illustrating an example of the structure of a thin film transistor (TFT) according to the present invention. The TFT includes an Na diffusion preventive film 11 formed on a glass substrate (insulating substrate) 10, a gate electrode 12 (the part of the gate electrode is shown in FIG. 1) and a wiring layer of Al or Al alloy formed on the Na diffusion preventive film 11 in a predetermined pattern, a dense anodic oxide film 13 formed on the surface of the gate electrode 12 by anodization using a non-aqueous solution, a transparent resin layer 14 which surrounds the gate electrode 12, has almost the same level as that of the upper surface of the anodic oxide film 13 on the upper surface of the gate electrode 12, and is almost flush with the upper surface of the anodic oxide film 13, a semiconductor layer 15 formed on the anodic oxide film 13 on the gate electrode 1, and a source electrode 17 and drain electrode 18 connected to an electrode connection region 16 of the semiconductor layer 15.

A method of forming a thin film transistor according to this embodiment, as described above, will be described next with reference to FIGS. 2(a) to 2(g). FIGS. 2(a) to 2(g) are schematic views illustrating an example of a method of manufacturing a thin film transistor according to this embodiment in the order of steps. First, referring to FIG. 2(a), an inexpensive soda glass or alkali glass substrate 10 is prepared as a substrate. A large substrate that can be used to form a screen with a side as large as 30 inches or more may be used as the glass substrate 10. The glass substrate 10 is treated using a 0.5 vol % hydrofluoric acid solution for 10 sec, and rinsed with pure water to perform lift-off removal. Then, as shown in FIG. 2(b), a solution obtained by dissolving a composition of $((CH_3)SiO_{3/2})_x(SiO_2)_{1-x}$ (for $0 < x \leq 1.0$) in an organic solvent is applied to the surface of the soda glass substrate 10 using a slit coater. The glass substrate 10 is heated at reduced pressure to completely remove the solvent. More specifically, the glass substrate 10 is heated at reduced pressure of 1 to 5 Torr (133 to 665 Pa) at 400° C. The insulation characteristics of the thus formed transparent alkali diffusion preventive film 11 with a thickness of 0.2 μm have excellent values: a current density of $1 \times 10^{-10}$ A/cm$^2$ for 1 MV/cm, a current density of $1 \times 10^{-9}$ A/cm$^2$ for 3 MV/cm, and even a current density of $1 \times 10^{-8}$ A/cm$^2$ for 5 MV/cm. Upon examination of the sodium diffusion prevention performance of the coating alkali diffusion preventive film 11, it was confirmed that the difference in sodium diffusion from the glass substrate 10 containing sodium to the Na diffusion preventive film 11 remained the same between post-calcination and post-annealing when the film thickness fell within the range of 150 to 300 nm, so sodium diffusion could be perfectly prevented.

Figure 2:
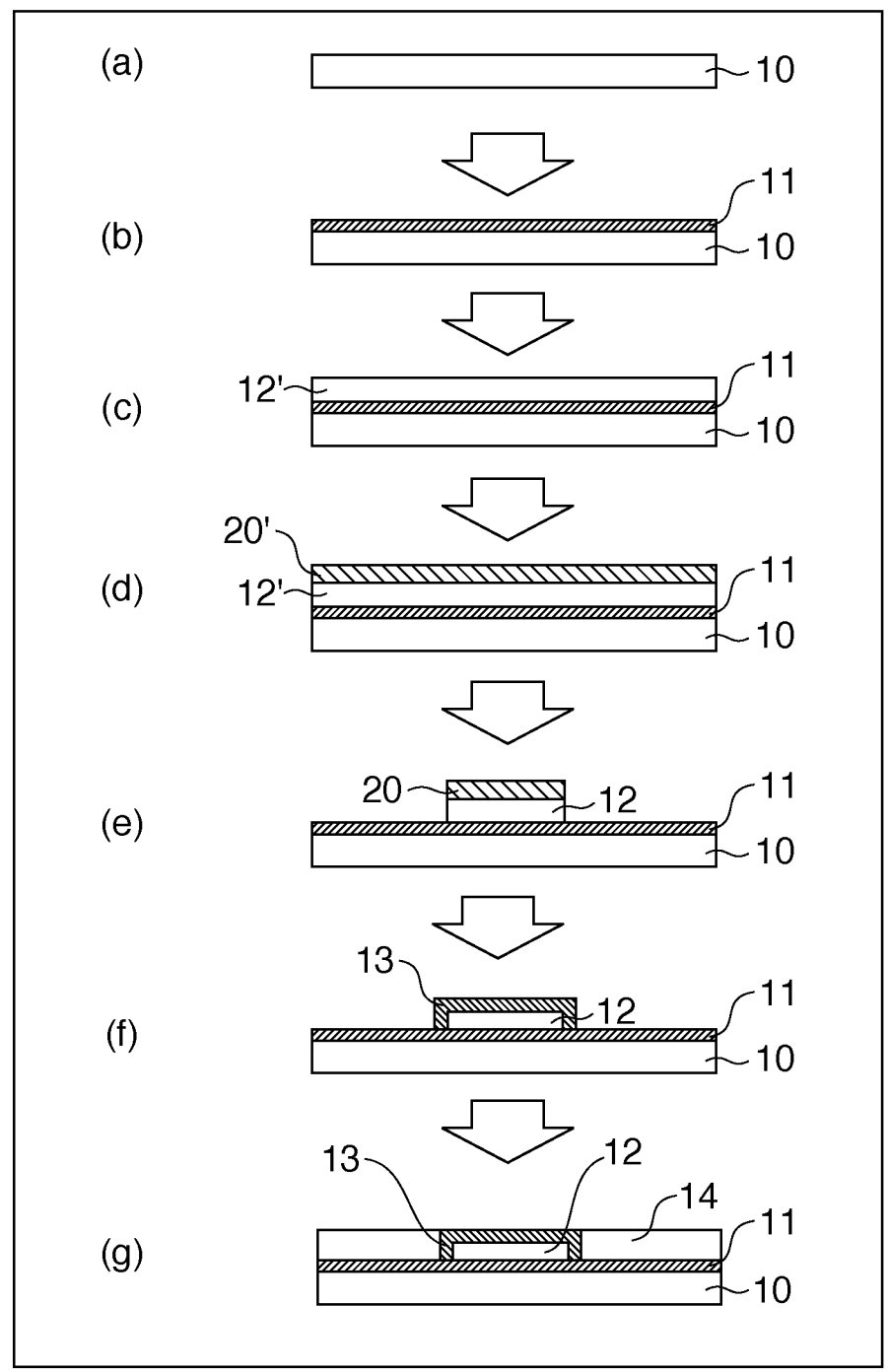
FIGS. 2(a) to 2(g) are sectional views for explaining an example of a method of manufacturing a thin film transistor according to the first embodiment of the present invention in the order of steps.

Referring to FIG. 2(*c*), an Al alloy layer 12' is formed on the alkali diffusion preventive film 11 of the substrate to have a thickness of 2 to 3 μm by sputtering. As shown in FIG. 2(*d*), a photoresist 20' is applied to the Al alloy layer 12', the resist is left in a predetermined pattern 20 by known exposure/development, as shown in FIG. 2(*e*), and the Al alloy layer 12' is processed to form a predetermined gate electrode/wiring pattern 12 by dry etching using the residual resist as a mask. The resist 20 is removed, and the surface of the Al alloy 12 is anodized using a non-aqueous solution, as described earlier, to form an anodic oxide film 13, as shown in FIG. 2(*f*).

Note that in depositing the Al alloy layer 12' in this embodiment, an Al alloy used for a sputter target is an Al alloy containing Mg with a concentration of 0.01 mass % or less, Zr with a concentration of 0.01 mass % (exclusive) to 0.15 mass % (inclusive), and the balance of Al and unavoidable impurities, which have elements with concentrations of 0.1 mass % or less. In this embodiment, the elements of the unavoidable impurities mainly include Si, Fe, and Cu, but Mn, Cr, and Zn, for example, unavoidably mix from, for example, a base metal material, a scrap, or a tool used in smelting an alloy. To obtain an alloy with such a purity, it is preferable to employ an alloy smelted with a base metal formed by Al with a purity as high as 99.98 mass % or more obtained by, for example, the segregation method or the trinal electrolytic method. Unavoidable impurities normally mix in a general-purpose Al alloy by about several parts per thousand, but must be kept in an amount of 0.01 mass % or less to avoid adverse effects such as degradation in uniformity of a film generated by an anodizing process.

By doping Zr in Al at a concentration that falls within the range of 0.01 mass % (exclusive) to 0.15 mass % (inclusive), a given mechanical strength is maintained while suppressing grain growth even after an annealing process is performed at about 350° C. Further, the Vickers hardness improves by doping Ce in Al at a concentration that falls within the range of 0.01 mass % (exclusive) to 15.0 mass % (inclusive), although this is not indispensable in the present invention. Note that since air cavities are formed in the members when the doping amount of Ce exceeds 5.0%, the doping amount of Ce is preferably 5.0% or less, but the air cavities can also be removed by the HIP (Hot Isostatic Pressing) process.

In this embodiment, an amorphous Zr-doped $Al_2O_3$ film is formed as an anodic oxide film 13 on the surface of the Zr-doped Al alloy layer 12 to have a thickness of about 0.1 μm to 0.6 μm by anodization using a non-aqueous solution. The non-aqueous solution used contains ethylene glycol or diethylene glycol as a solvent, and pure water and adipic acid as a solute. Since a gate insulating film is preferably as thin as possible, the thickness of the anodic oxide film 13 is 0.1 μm.

As shown in FIG. 2(*g*), a solution obtained by dissolving, in a solvent, one or more types of resins selected from the group consisting essentially of acrylic resin, silicone resin, fluorine resin, polyimide resin, polyolefin resin, alicyclic olefin resin, and epoxy resin is applied to the periphery of the gate electrode/wiring layer 12 by a slit coater to have almost the same level as that of the gate electrode 12 and the anodic oxide film 13 formed on its upper surface, and is dried to form a transparent resin layer 14 almost flush with the upper-surface anodic oxide film 13. Note that an alkali-soluble alicyclic olefin resin composition is preferably used as the resin.

Figure 3:
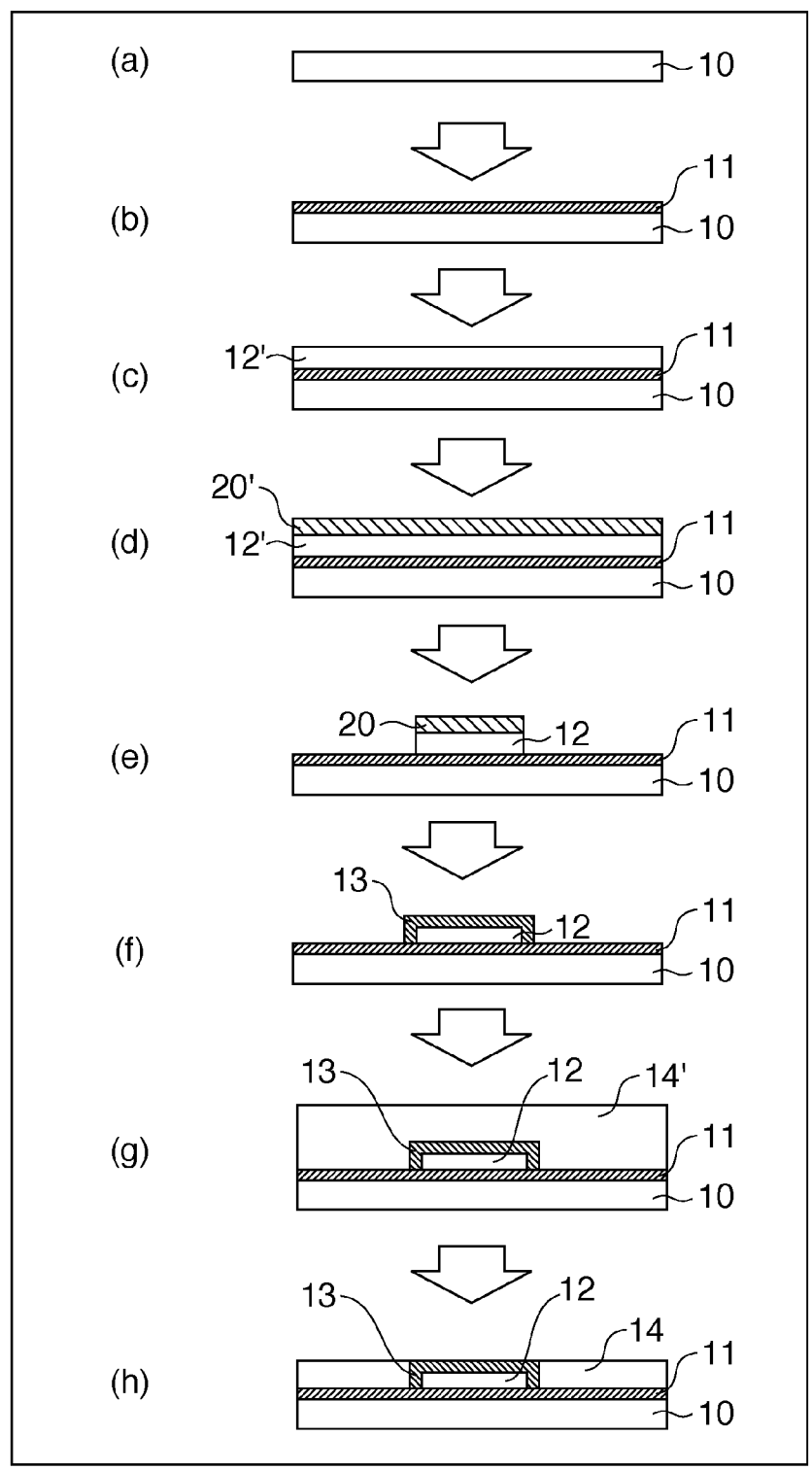
FIGS. 3(a) to 3(h) are sectional views for explaining another example of a method of manufacturing a thin film transistor according to the first embodiment of the present invention in the order of steps.

Another embodiment of a method of manufacturing a thin film transistor according to the present invention will be described next with reference to FIGS. 3(*a*) to 3(*h*). Note that steps in FIGS. 3(*a*) to 3(*f*) are the same as in those in FIGS. 2(*a*) to 2(*f*), and a description thereof will not be given. Referring to FIG. 3(*g*), a transparent insulating film 14' is deposited to have a level higher than those of the gate electrode/wiring line 12 and the gate insulating film 13 formed on its upper surface. The substrate 10 having the transparent insulating film 14' formed at its top is placed in a microwave excited plasma treatment apparatus, krypton and oxygen gases are introduced into the apparatus, a microwave is also introduced into the apparatus to generate a plasma, and the surface of the transparent insulating film 14' is removed by etch-back to expose the surface of the gate insulating film 13, as shown in FIG. 3(*h*). At this time, as the exposed surface of the gate insulating film 13 is exposed to oxygen radicals generated by the plasma, oxidation progresses to improve the film quality.

Figure 4:
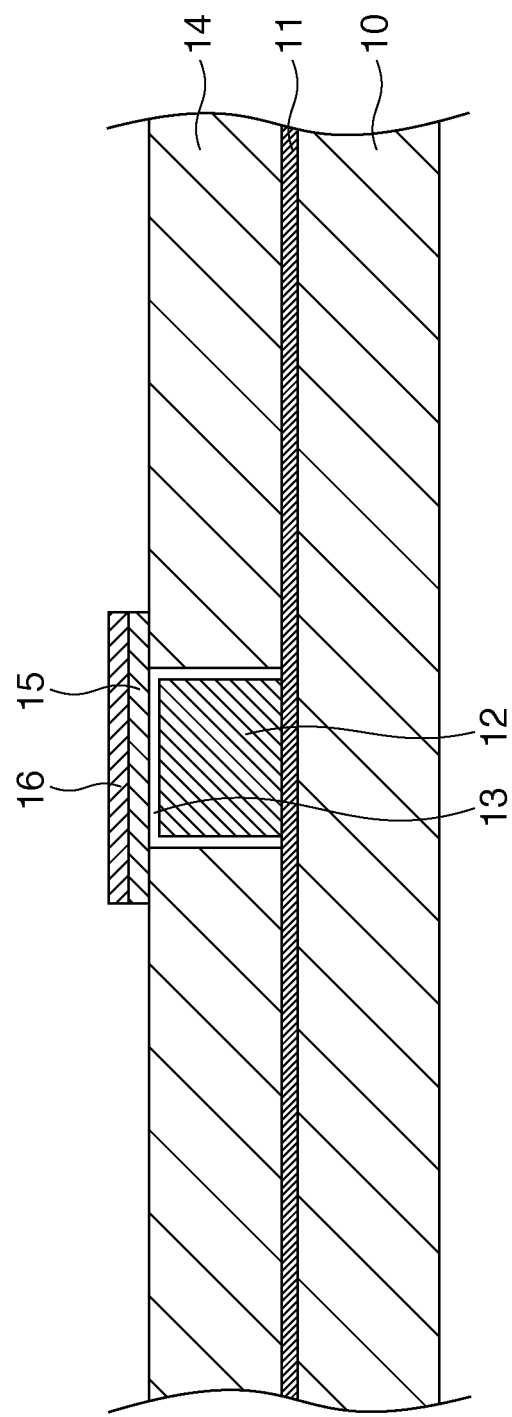
FIG. 4 is a sectional view for explaining a step subsequent to those shown in FIG. 2 or 3 in the method of manufacturing a thin film transistor according to the first embodiment of the present invention.

Referring to FIG. 4, subsequently to a step in FIG. 2(*g*) or 3(*h*), in a metal surface microwave excitation plasma treatment apparatus (MSEP), an amorphous silicon film 15 and an $n^+$-type amorphous silicon film 16 were continuously deposited to cover the gate electrode 12 through the gate insulating film 13 using the PECVD method, and the amorphous silicon films 15 and 16 other than the surface of the gate electrode 12 and its periphery were partially removed using the photolithography method and the known RIE method.

As shown in FIG. 1, using, for example, a known sputter method, Ti, Al, and Ti were deposited in this order to form source and drain electrodes, and patterned using the photolithography method to form a source electrode 17 and a drain electrode 18. The $n^+$-type amorphous silicon film 16 was etched by a known method using the formed source electrode 17 and drain electrode 18 as a mask to isolate the source and drain regions from each other. A silicon nitride film (not shown) was formed as a protective film using the known PECVD method to complete a thin film transistor according to this embodiment.

Figure 5:
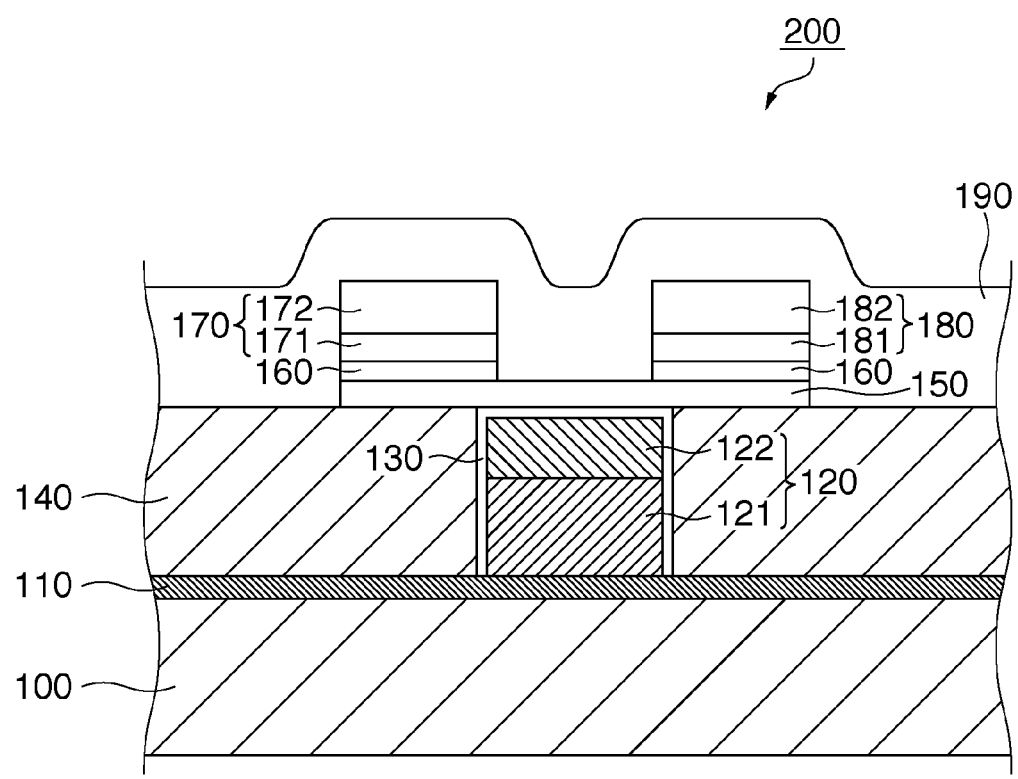
FIG. 5 is a sectional view showing the structure of a thin film transistor according to the second embodiment of the present invention.

A structure and a manufacturing method according to the second embodiment of the present invention will be described below with reference to FIG. 5. A thin film transistor (TFT) 200 according to the second embodiment of the present invention includes an Na diffusion preventive film 110 formed on a soda glass substrate 100, a gate electrode/gate driving wiring layer 120 (the part of the gate electrode is shown in FIG. 5) in which a lower layer 121 formed on the Na diffusion preventive film 110 in a predetermined pattern is made of Al, and an upper layer 122 is made of Al—Zr alloy, and a dense anodic oxide film 130 formed on the surface of the gate electrode 120 by anodization using a non-aqueous solution. The TFT 200 shown in FIG. 5 includes a transparent resin layer 140 which is arranged to surround the gate electrode/wiring layer 120, is formed to have almost the same level as that of the upper surface of the anodic oxide film 130 on the upper surface of the gate electrode 120, and is almost flush with the upper-surface anodic oxide film 130, and an intrinsic amorphous silicon (i-aSi) layer 150 formed on the anodic oxide film 130 on the gate electrode 120. Source and drain electrode connection regions are formed on the i-aSi layer 150.

Of these two regions, the source electrode connection region is provided with a high concentration $n^+$-type amorphous silicon ($n^+$-aSi) layer 160, and has a source electrode 170 which includes a lower layer 171 formed by Zr and an upper layer 172 formed by Al and is in contact with the surface of the $n^+$-type amorphous silicon ($n^+$-aSi) layer 160.

On the other hand, the drain electrode connection region is provided with a high concentration n+-type amorphous silicon (n+-aSi) layer 160, and has a drain electrode 180 which includes a lower layer 181 formed by Zr and an upper layer 182 formed by Al and is in contact with the surface of the n+-type amorphous silicon (n+-aSi) layer 160. The exposed portion of the source electrode 170, drain electrode 180, and i-aSi layer 150 is covered by an SiCN protective film 190, which covers the top surface of the device.

A method of forming a thin film transistor according to this embodiment, as described above, will be described below with reference to FIG. 5. First, an inexpensive soda glass substrate 100 is prepared as a substrate. The glass substrate 100 is treated using a 0.5 vol % hydrofluoric acid solution for 10 sec, and rinsed with pure water to perform lift-off removal. Then, a solution obtained by dissolving a composition of $((CH_3)SiO_{3/2})_x(SiO_2)_{1-x}$ (for $0<x \leq 1.0$) in an organic solvent is applied to the surface of the soda glass substrate 100 using a slit coater. The soda glass substrate 100 is heated at reduced pressure to completely remove the solvent. More specifically, the soda glass substrate 100 is heated at reduced pressure of 5 Torr (665 Pa) at 400° C. With this operation, a transparent alkali diffusion preventive film 110 is formed to have a thickness of 0.2 μm to 0.3 μm. An Al layer 121 is formed on the alkali diffusion preventive film 110 of the substrate to have a thickness of 1.5 to 2.0 μm by sputtering, an Al alloy layer (containing 0.1 mass % of Zr and the balance of Al (Mg has a concentration equal to or lower than a detection limit, or 0.01 mass % or less)) 122 is deposited on the Al layer 121 to have a thickness of 0.5 to 1.5 μm by sputtering, a photoresist (not shown) is applied onto the Al alloy layer 122, the resist is left in a predetermined pattern (gate electrode and gate driving wiring pattern) by known exposure/development, and the Al layer 121 and Al alloy layer 122 are processed to form a predetermined gate electrode/wiring pattern 120 by dry etching using the residual resist as a mask. The resist is removed, and the surface of the gate electrode/wiring pattern 120 is anodized using a non-aqueous solution to form an anodic oxide film 130.

Note that the Al layer 121 and Al alloy layer 122 in this embodiment can contain elements of unavoidable impurities, such as Si, Fe, Cu, Mn, Cr, and Zn, with concentrations of 0.01 mass % or less, as described earlier. Also, the Al alloy layer 122 may contain Mg with a concentration of 0.01 mass % or less, Ce with a concentration of 0.01 mass % or less, Zr with a concentration of 0.01 mass % (exclusive) to 0.15 mass % (inclusive), and the balance of Al and unavoidable impurities.

In this embodiment, an $Al_2O_3$ film (Zr is doped in the portion formed on the surface of the Al alloy layer 122) is formed on the surfaces of the Al layer 121 and Al alloy layer 122 to have a thickness of 0.05 μm to 0.1 μm as an anodic oxide film 130 by anodization using a non-aqueous solution. This corresponds to an EOT of 0.025 μm to 0.05 μm for a gate insulating film. The non-aqueous solution used contains 79% of ethylene glycol as a solvent, and 20% of pure water and 1.0% of adipic acid (volume ratio) as a solute, or 79.5% of diethylene glycol, 20% of pure water, and 0.5% of adipic acid as a solute. At room temperature in the former, or at 50° C. in the latter, anodization is performed first in a constant current mode in which a current density of 0.1 mA/cm² to 0.2 mA/cm² is used, and anodization is performed next in a constant voltage mode in which a voltage of 60 V to 30 V is used. In nitrogen and oxygen gas atmospheres, an anodic oxide film is annealed at 300° C. for about 1 hr.

A solution obtained by dissolving an alkali-soluble alicyclic olefin resin composition in a solvent is deposited around the gate electrode/wiring layer 120 by a slit coater to have a level higher than that of the anodic oxide film 130 on the upper surface of the gate electrode 120 to form a transparent organic insulating film. In a microwave excited plasma treatment apparatus, krypton and oxygen gases are introduced into the apparatus, a microwave is also introduced into the apparatus to generate a plasma, and the entire surface of the transparent organic insulating film is etched to expose the surface of the gate insulating film 130. At this time, as the exposed surface of the gate insulating film 130 is exposed to oxygen radicals generated by the plasma, oxidation progresses to improve the film quality. A transparent organic insulating film 140 is formed to have the same level as that of the surface of the gate insulating film 130.

As described earlier, an intrinsic amorphous silicon film is formed on the flat surfaces of the gate insulating film 130 and transparent resin layer 140 to have a thickness of 0.02 to 0.1 μm using the PECVD method, and an n+-type amorphous silicon film is continuously deposited on it to have a thickness of 0.05 to 0.1 μm. Further, Zr is deposited to have a thickness of 0.1 to 0.2 μm, and Al is continuously deposited on it to have a thickness of 0.5 μm. The Al/Zr/n+-type amorphous silicon film/intrinsic amorphous silicon film is removed using the photolithography method and known RIE method while leaving a predetermined pattern (the surface of the gate electrode 120 and its periphery). With this operation, an intrinsic amorphous silicon film 150 is formed in a predetermined pattern (the surface of the gate electrode 120 and its periphery). The Al/Zr/n+-type amorphous silicon film other than the source and drain regions is removed by etching to isolate the source and drain regions to form an n+-type amorphous silicon film 160, Al/Zr source electrode 170, and Al/Zr drain electrode 180 in the source and drain regions. An SiCN film 190 is formed as a protective film using the PECVD method.

Note that wiring contact to the source and drain electrodes 170 and 180 is done by forming through holes in the SiCN protective film 190.

The TFT 200 obtained in the second embodiment is provided with a Zr-doped Al alloy layer 122 in the upper layer of the gate electrode 120. With this arrangement, a dense, high-quality anodic oxide film can be formed in the Zr-doped Al alloy layer 122 than the case wherein only the Al layer 121 is formed. Hence, a Zr-doped anodic oxide film 130 formed on the Zr-doped Al alloy layer 122 can also be formed to have a high density and high quality (to have a high insulation performance and high breakdown voltage despite its thinness).

Although exemplary embodiments and manufacturing steps according to the present invention have been described above, the present invention is not limited to this, and a silicon nitride film, for example, may be formed on the surface of the upper-surface anodic oxide film 13 or 130 as a composite gate insulating film using the CVD method as needed. Also, although a Zr-doped Al alloy is used for the gate electrode/wiring line in this embodiment, an electrode of another material may be used for the inner or lower portion. That is, at least the upper surface of a gate electrode or wiring line may be formed by Zr-doped Al, its surface may be oxidized by anodization using a non-aqueous solution to form a Zr-doped $Al_2O_3$ film, and this film may be used for at least part of the gate insulating film.

Figure 6:
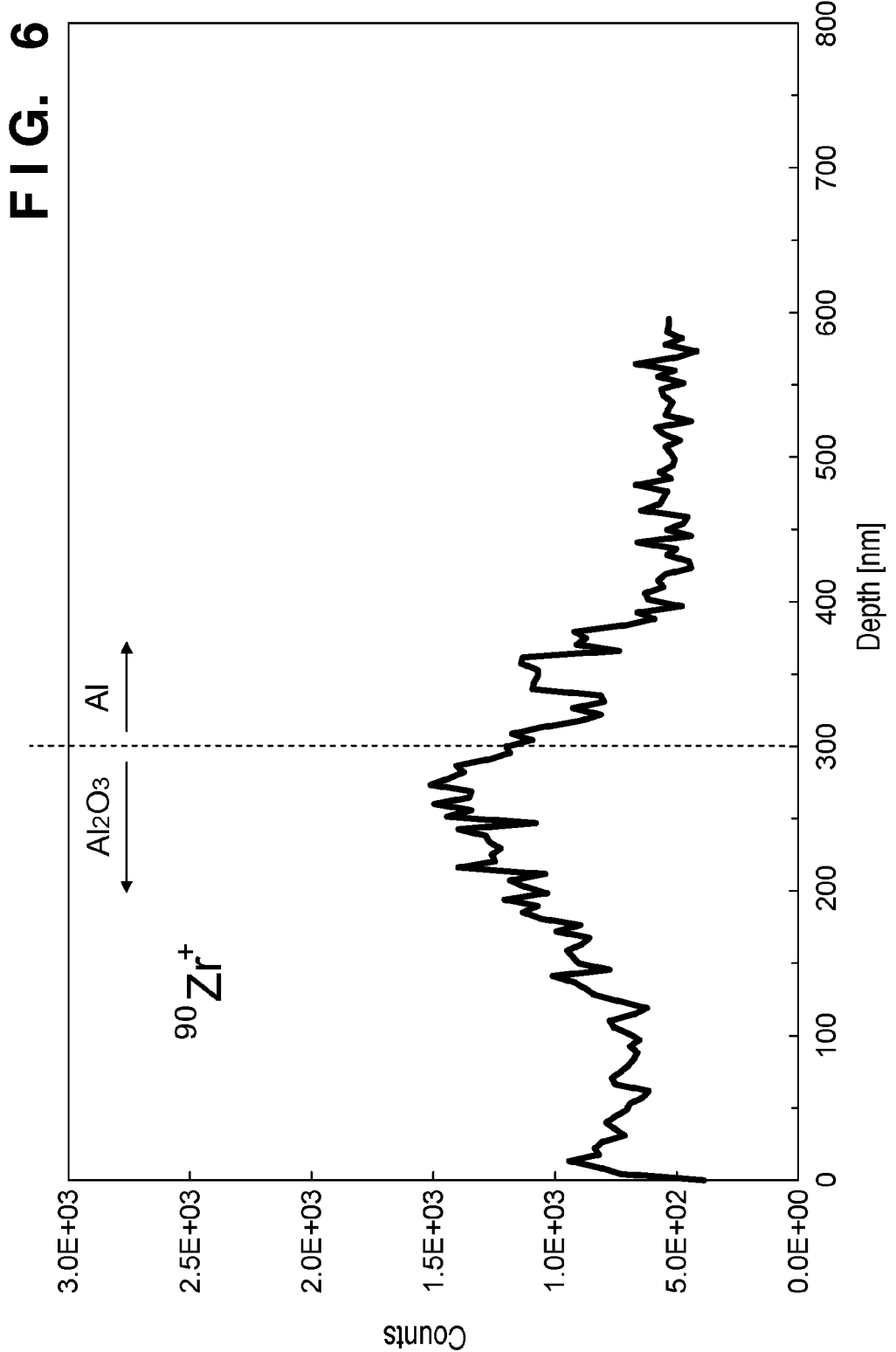
FIG. 6 is a graph showing SIMS analysis of an anodic oxide film of a Zr-doped Al alloy.

FIG. 6 shows the SISM analysis result obtained when an Al surface containing 0.1% of Zr is anodized using a non-aqueous solution, as described above, to form an anodic oxide film with a thickness of 300 nm. As is obvious from FIG. 6, Zr is found to be doped in an anodic oxide film formed on a Zr-doped Al surface by anodization using a non-aqueous solution.

Figure 7:
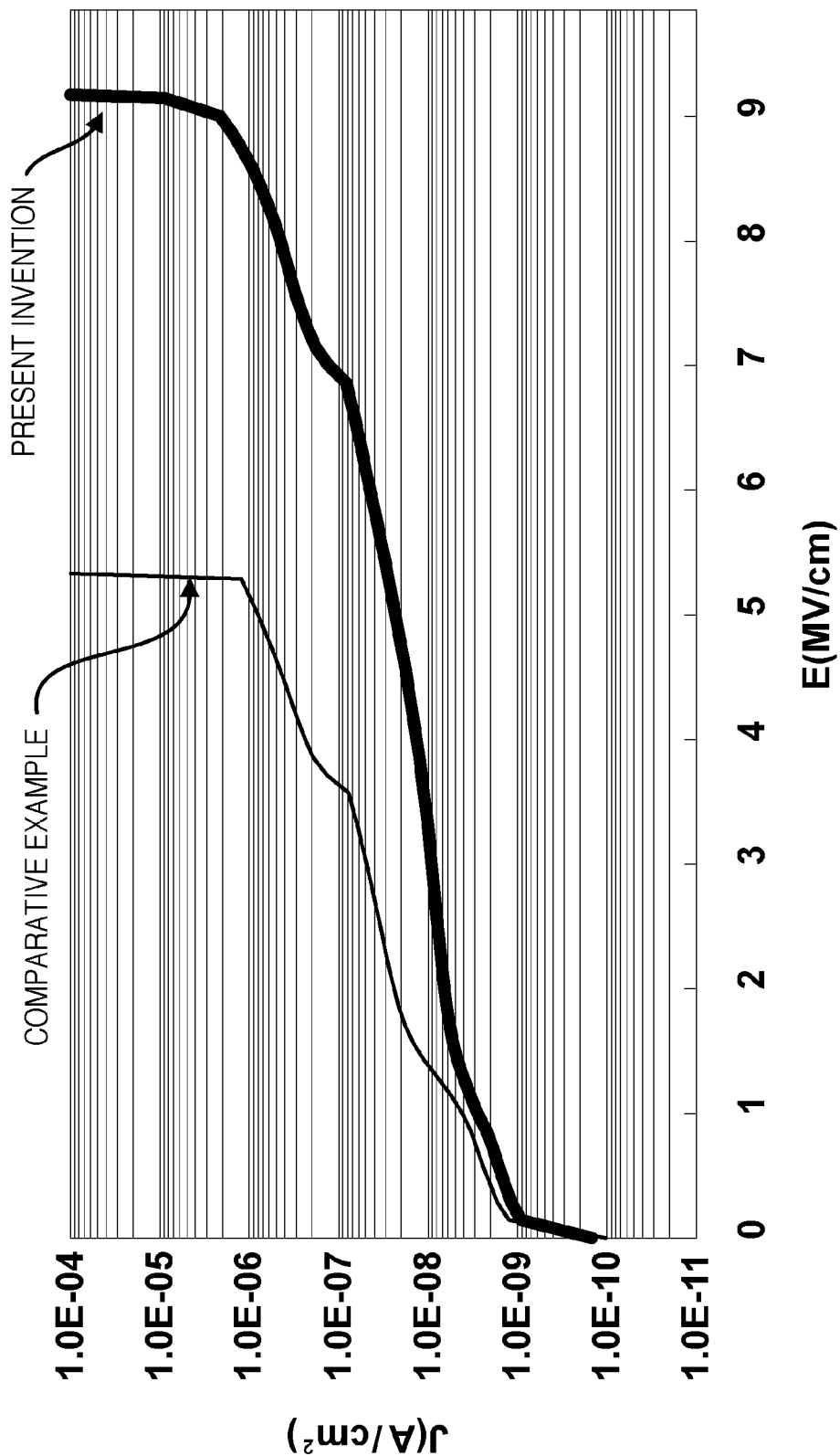
FIG. 7 is a graph showing the characteristics of a gate insulating film of a thin film transistor according to an embodiment of the present invention.

FIG. 7 shows the result ("Present Invention" in FIG. 7) of measuring an electric field strength E (MV/cm) (abscissa) and a leakage current J (A/cm$^2$) (ordinate) of an 80-nm thick anodic oxide film obtained by forming a 0.1% Zr-doped Al film by sputtering and anodizing its surface using a non-aqueous solution. FIG. 7 also shows as a Comparative Example, the measurement value of an 80-nm thick anodic oxide film obtained by forming an Al film doped with 4.5% of Mg, 1.0% of Ce, and 0.1% of Zr by sputtering and anodizing its surface using a non-aqueous solution. The anodic oxide film was formed by anodization at a constant voltage of 50 V and then at a constant current of 0.5 µA/cm$^2$ using a solution of 79% EG/20% H$_2$O/1% ADA at 23° C. for 2 hrs, and annealing in a nitrogen atmosphere at reduced pressure/annealing in an oxygen atmosphere at normal pressure at 300° C. for 1 hr. As is obvious from FIG. 7, an anodic oxide film doped with only Zr ("Present Invention" in FIG. 7) has a lower leakage current and a higher breakdown voltage than the Comparative Example, and therefore serves as an excellent gate insulating film.

INDUSTRIAL APPLICABILITY

The present invention is applicable to display devices such as a liquid crystal display device, an organic EL device, and an inorganic EL device to increase the sizes of these display devices, and is also applicable to wiring lines other than those for display devices.

REFERENCE SIGNS LIST 10, 100 . . . transparent substrate
11, 110 . . . Na diffusion preventive film
12, 120 . . . gate electrode/wiring layer
13, 130 . . . anodic oxide film
14, 140 . . . transparent resin layer
15 . . . semiconductor layer
16 . . . electrode contact layer
17 . . . source wiring layer
18 . . . drain wiring layer

What is claimed is:

1. A semiconductor device, comprising:
a transistor which includes a gate electrode, a gate insulating film, an insulator layer, a semiconductor layer, a source electrode and a drain electrode;
the gate electrode comprising Al and Zr, and being formed on a substrate;
the gate insulating film comprising Al and Zr, and covering at least an upper surface of the gate electrode;
the insulator layer formed on the substrate surrounding the gate electrode; and
the semiconductor layer being formed on the gate insulating film.

2. The semiconductor device according to claim 1, wherein a thickness of the gate insulating film is 20 nm (inclusive) to 80 nm (inclusive).

3. A semiconductor device, comprising:
a gate electrode comprising Al and Zr, and being formed on a substrate;
a gate insulating film comprising Al and Zr, and covering at least an upper surface of the gate electrode; and
an insulator layer formed on the substrate surrounding the gate electrode, wherein
the gate electrode contains Mg at a concentration of not more than 0.01 mass %.

4. A semiconductor device, comprising:
a gate electrode comprising Al and Zr, and being formed on a substrate;
a gate insulating film comprising Al and Zr, and covering at least an upper surface of the gate electrode, and
an insulator layer formed on the substrate surrounding the gate electrode, wherein
the gate electrode contains Mg at a concentration of not more than 0.01 mass %, and from 0.01 mass % (exclusive) to 0.15 mass % (inclusive) Zr.

5. The semiconductor device according to claim 1, wherein the gate insulating film includes a nonporous anodic oxide film formed by anodization using a non-aqueous solution.

6. A semiconductor device, comprising:
a gate electrode comprising Al and Zr, and being formed on a substrate;
a gate insulating film comprising Al and Zr, and covering at least an upper surface of the gate electrode; and
an insulator layer formed on the substrate surrounding the gate electrode, wherein
the substrate includes a substantially transparent insulator substrate, and the insulator layer includes a substantially transparent resin layer.

7. The semiconductor device according to claim 6, wherein the resin layer includes at least one type of resin selected from the group consisting essentially of acrylic resin, silicone resin, fluorine resin, polyimide resin, polyolefin resin, alicyclic olefin resin, and epoxy resin.

8. The semiconductor device according to claim 6, wherein the resin layer is formed by an alkali-soluble alicyclic olefin resin composition.

9. The semiconductor device according to claim 6, wherein the substrate includes alkali glass, and an alkali diffusion preventive film formed on the alkali glass.

10. The semiconductor device according to claim 9, wherein the alkali diffusion preventive film includes a substantially transparent insulator coating film.

11. The semiconductor device according to claim 10, wherein the insulator coating film includes a film obtained by drying and calcining a liquid coating film containing at least one of a metal organic compound and a metal inorganic compound, and a solvent.

12. A method of manufacturing a semiconductor device comprising a gate electrode, a gate insulating film, an insulator layer, a semiconductor layer, a source electrode and a drain electrode, the method comprising the steps of:
forming the gate electrode on a substrate, said gate electrode comprising Al and Zr;
forming the gate insulating film by anodizing a surface of the gate electrode by an anodizing method using a non-aqueous solution; and
forming the insulator layer on the substrate surrounding the gate electrode.

13. The method of manufacturing a semiconductor device according to claim 12, wherein the gate insulating film has a thickness of 20 nm (inclusive) to 80 nm (inclusive).

14. A method of manufacturing a semiconductor device, comprising the steps of:
forming a gate electrode comprising Al and Zr on a substrate;
forming a gate insulating film by anodizing a surface of the gate electrode by an anodizing method using a non-aqueous solution; and
forming an insulator layer on the substrate surrounding the gate electrode, wherein
the gate electrodes contains Mg at a concentration of not more than 0.01 mass %.

15. A method of manufacturing a semiconductor device, comprising the steps of:
   forming a gate electrode comprising Al and Zr on a substrate;
   forming a gate insulating film by anodizing a surface of the gate electrode by an anodizing method using a non-aqueous solution; and
   forming an insulator layer on the substrate surrounding the gate electrode, wherein
   the gate electrode contains Mg at a concentration of not more than 0.01 mass % and Zr at a concentration of 0.01 mass % (exclusive) to 0.15 mass % (inclusive).

16. A method of manufacturing a semiconductor device, comprising the steps of:
   forming a gate electrode comprising Al and Zr on a substrate;
   forming a gate insulating film by anodizing a surface of the gate electrode by an anodizing method using a non-aqueous solution; and
   forming an insulator layer on the substrate surrounding the gate electrode, wherein
   said step of forming the insulator layer comprises (i) forming a material which forms the insulator layer to extend from a position on the substrate to a position on the gate electrode, and (ii) removing a surface of the material that forms the insulator layer using a plasma containing oxygen.

17. The method of manufacturing a semiconductor device according to claim 16, wherein the step of removing the surface of the material that forms the insulator layer using plasma includes the steps of:
   exposing the gate insulating film; and
   modifying the exposed gate insulating film using the plasma.

18. A display device comprising a semiconductor device comprising:
   a gate electrode comprising Al and Zr, and being formed on a substrate;
   a gate insulating film comprising Al and Zr, and covering at least an upper surface of the gate electrode; and
   an insulator layer formed on the substrate surrounding the gate electrode.

* * * * *